United States Patent [19]

Kaufman et al.

[11] Patent Number: 5,281,913
[45] Date of Patent: Jan. 25, 1994

[54] NMR RELAXOMETRY USING FIXED RF FREQUENCY BAND

[75] Inventors: Leon Kaufman, San Francisco; Joseph W. Carlson, Kensington, both of Calif.

[73] Assignee: The Regents of the University of California, Oakland, Calif.

[21] Appl. No.: 705,964

[22] Filed: May 28, 1991

Related U.S. Application Data

[63] Continuation-in-part of Ser. No. 545,068, Jun. 29, 1990.

[51] Int. Cl.⁵ .......................................... G01R 33/20
[52] U.S. Cl. ..................................... 324/309; 324/300
[58] Field of Search .................... 324/309, 307, 300; 128/653.2

[56] References Cited

U.S. PATENT DOCUMENTS

| | | | |
|---|---|---|---|
| 3,774,103 | 11/1973 | Laukien | 324/313 |
| 4,573,015 | 2/1986 | Abe et al. | 324/309 |
| 4,602,641 | 7/1986 | Feinberg | 128/653 |
| 4,713,616 | 12/1987 | Shimazaki et al. | 324/309 |
| 4,716,369 | 12/1987 | Sekihara et al. | 324/309 |
| 4,887,034 | 12/1989 | Smith | 324/307 |
| 4,962,357 | 10/1990 | Sotak | 324/309 |
| 5,034,692 | 7/1991 | Laub et al. | 324/309 |
| 5,057,776 | 10/1991 | Macovski | 324/309 |

FOREIGN PATENT DOCUMENTS

| | | |
|---|---|---|
| 2210982A | 6/1989 | United Kingdom . |
| WO90/03583 | 4/1990 | World Int. Prop. O. . |

OTHER PUBLICATIONS

Yee et al, "Localized Volume Selection Technique Using An Additional Radial Gradient Coil", pp. 56-63, *Magnetic Resonance in Medicine*, No. 12, 12 (1989) Oct., Duluth, Minn., U. S.

Cho et al, "Time-of-Flight MR Angiography Using Selective Saturation Method" 1988, Society of Magnetic Resonance in Medicine, 7th Annual Meeting and Exhibition, San Francisco, Calif., U. S.

Yamada et al, "NMR Fresnel Transform Imaging Using a Scannable Nonlinear Field Gradient," Electronics and Communication in Japan, Part 2, vol. 71, No. 3, 1988, Silver Springs, Md., U. S.

N. Lundbom et al, "Magnetic Field Dependence of 1/T1 of Human Brain Tumors," Investigative Radiology, No. 1990, vol. 25, pp. 1197-1205.

Koenig et al, "A Field-cycling Relaxometer, " NMR spectroscopy of Cells & Organism, vol. II, Raj K. Gupta, Editor, CRC Press, Boca Raton, Fla. (1987), pp. 108-114.

Crooks et al, "Magnetic Resonance Imaging: Effects of Magnetic Field Strength," Radiology, vol. 151, No. 1, Apr. 1984, pp. 127-133.

Ortendahl et al, "Analytical Tools for Magnetic Resonance Imaging, " Radiology, vol. 153, No. 2. Nov. 1984, pp. 479-488.

*Primary Examiner*—Michael J. Tokar
*Assistant Examiner*—Raymond Y. Mah
*Attorney, Agent, or Firm*—Nixon & Vanderhye

[57] ABSTRACT

MRI T1 relaxometry is performed using a single fixed strength magnetic background field for RF signal transmission and reception thus greatly simplifying RF circuitry design and/or adjustment. Switched differing strength background magnetic fields are employed at other times in the relaxometry cycle so as to predominate the NMR T1 relaxation parameter value and thus permit relaxometry determinations of T1 values versus magnetic field strength (or the equivalent corresponding NMR RF frequency) at N data points using as few as N+1 measurement cycles. Process and apparatus are disclosed for thus efficiently achieving in vivo NMR relaxometry (including magnetic resonance imaging if desired).

40 Claims, 4 Drawing Sheets

NMR RELAXOMETRY USING FIXED RF FREQUENCY BAND

This application is a continuation-in-part of commonly assigned copending U.S. patent application Ser. No. 07/545,068 filed Jun. 29, 1990 entitled "Switched-Field MRI" and naming Messrs. Carlson, Crooks and Kaufman as joint inventors. The entirety of this related copending application is hereby incorporated by reference.

This invention relates to method and apparatus for performing nuclear magnetic resonance (NMR) relaxometry. In vivo magnetic resonance imaging (MRI) may be simultaneously employed so as to provide NMR relaxometry measurements for the voxels of two or three dimensional images of living tissue. In effect, NMR relaxometry is used in imaging sequences having an acceptable total imaging time.

The referenced related copending application describes MRI apparatus and method wherein the background magnetic strength $B_o$ may be selectively switched to different magnitudes at different times in NMR pulse sequences for different effects. However, it does not explicitly discuss NMR relaxometry.

NMR relaxometry is per se known. For example, Lundbom et al in "Magnetic Field Dependence of $1/T_1$ of Human Brain Tumors," *Investigative Radiology*, November 1990, Vol. 25, pp 397-1205 describe NMR relaxometry providing plots of proton relaxation rates T1 versus proton Larmor frequency/magnetic field strength. As Lundbom et al have shown, different types of tissue may be distinguished (i.e., identified) as a function of such relaxometry measurements.

Koenig also describe "A Field-Cycling Relaxometer" in a chapter on Relaxometry of Tissue within the text of "NMR Spectroscopy of Cells & Organisms," Volume II, Raj K. Gupta, Editor, CRC Press, Boca Raton, FL (1987), pp 108-114. Koenig et al first equilibrate nuclei at either zero Gauss or very high Gauss (e.g., 1.2 T). Then the field is switched to a T1 measurement value and, after a "measurement time to allow exponential field change at this new field, the field is changed to a fixed NMR value at which a 90°-180° spin echo measurement is quickly made. Since this SE magnitude is proportional to the magnetization achieved during the selected measurement time, one can effectively plot the exponential change in nuclei magnetization (and thus discern T1) by repeating the experiment for different measurement times. Koenig et al describe 23 cycles for each T1 measurement at a given field strength. However, as noted, all RF signals are conveniently made at a fixed magnetic field value.

Traditional NMR relaxometry (e.g., such as that in Koenig) is performed on an entire sample (e.g., as contained in a test tube within laboratory NMR apparatus). Such is not conducive to in vivo measurements—such as in the context of magnetic resonance imaging (MRI).

Ramping or changing the background magnetic field strength (e.g., as might be suggested by Lundbom et al) is not possible in conventional permanent magnet MR systems and is, at best, time consuming in a resistive or superconductive solenoidal magnet MRI system (especially if the time to reach stable magnet operation is added to the ramping of the magnetic field strength itself).

Such a straight forward approach to in vivo NMR/MRI relaxometry also would require the RF transmitter/receiver frequency (ann all attendant RF circuits, coils, amplifiers, etc.) to be changed and/or retuned to the new NMR Larmor frequency associated with the new background field strength.

Koenig et al is at least a more interesting approach since all RF measurements are made at a fixed magnetic field strength—and hence at fixed RF frequency bands. However, the Koenig et al approach will cause nuclei magnetization to partly equilibrate during the NMR measurement phase. If only a small field change is involved, the change in equilibrium magnetization may also be very small. To enhance the change in magnetization, Koenig et al allows the nuclei magnetization to first come to equilibrium with either a very strong (e.g., 1.2 T) or very weak (e.g., zero) magnetic field. Furthermore, this prior "soak" field is re-applied before each of many (e.g., 23) data point measurement cycles (e.g., using many different measurement time intervals at each given measurement field value). Such a technique may be excellent for laboratory samples without imaging. However, it would take far too long for use in effective MR imaging procedures with in vivo patient anatomy.

Koenig et al use a technique of (1) applying a soak field, (2) applying a "relaxation rate field" for some amount of time and (3) doing NMR at a third field. The three steps are repeated using variable time delays in step (2).

Now, however, we have discovered a technique for using the field-switched MRI apparatus of our earlier above-referenced copending application so as to perform NMR relaxometry measurements at different effective background magnetic field strengths $B_o$—even in a two or three dimensional MRI context—in vivo, and still without the need to change RF operating frequencies from those employed in regular MRI procedures using a steady background magnetic field $B_o$. In effect, we dispense with step (1) of Koenig et al and apply step (2) with only one time delay. There are at least two exemplary ways to achieve this desired result.

1. One way is to first measure T1 at the base field of the magnet using any one of the common conventional techniques. Subsequent measurements at a switched field require solution of the Bloch equations for the evolution in a multistep, switched field. Finding T1 at the switched field involves solving an equation, an example is given below. This task can be programmed quite easily and solved numerically.

2. A second technique is to apply a 90 degree NMR RF pulse prior to the switched field. This is a distinct way of doing the measurement but may not turn out to be the most accepted technique. This is physically analogous to applying a zero "soak" field.

In our exemplary embodiment, the main magnet of a MRI system need not be changed or ramped. Rather, a switched additive/subtractive field can be raised or lowered relative to the main field and utilized only at times when RF signals are not being transmitted or received. In this way, the RF receiver/transmitter frequencies may be fixed to the usually expected frequencies and bandwidths and RF coils and other RF circuitry need not be unusually changed or manipulated.

Furthermore, in the second exemplary embodiment, instead of a long pre-"soak" period at an extremely high or extremely low magnetic field, we use a simple 90° NMR RF nutation pulse. This is roughly equivalent in results to applying a zero field for a very long time—but much easier and faster to implement.

We have also devised a technique for measuring T1 with just one application of the desired measurement field strength. While this may lower the effective signal-to-noise ratio (e.g., due to use of a reduced minimum size data set), the procedure is much more time-tolerable to an MRI patient.

In brief summary, the desired relaxometry background field strength is applied and maintained for a known duration $\Delta t$. It may be for a relatively long duration (e.g., on the order of the T1 parameter value being measured or longer). During this time no RF signals are being transmitted or received. However, in an immediately following time period—when the background field is at its usual nominal and fixed value $B_o$ the effective T1 value for the NMR nuclei is measured. If the measurement time period is substantially shorter than the relaxometry field period, the T1 value associated with the desired relaxometry field strength value will predominate and produce the desired measurements providing T1 versus magnetic field strength data for in vivo tissue containing the NMR nuclei.

If the measurement time period is not substantially shorter than the relaxometry field period, then a penalty is attached to this multi-field strength approach. Namely, within a single relaxometry data acquisition cycle, the calculation of T1 is somewhat more complicated—since NMR relaxation actually occurs at two different field strengths during the MRI relaxometry sequence.

Furthermore, by using an appropriate NMR/MRI sequence such as explained below in one of the exemplary embodiments, the computation can be simplified. For example, in one exemplary embodiment of this invention, a 90° RF NMR nutation pulse is introduced just prior to switching "on" the switched background field. Thereafter, immediately after switching the supplemental background field "off" (and therefore returning to the same constant background field strength $B_o$), a 90°-180° RF NMR nutation pulse sequence is performed so as to generate a spin echo RF NMR response within a relatively short time (i.e., a short TE). In such case, the T1 relaxation at the switched "on" composite background field strength dominates the observed change in NMR signal strength. Two such NMR measurement sequences using different time intervals between the 90° RF nutation pulses of appropriate lengths (e.g., as related by integer multiples) permit the T1 relaxation parameter to be determined in a relatively straightforward manner (e.g., in accordance with the teaching of Ortendahl et al, "Analytical Tools for Magnetic Resonance Imaging", Radiology, Vol. 153, No. 2, November 1984, pp 479-488) for one field strength. Thereafter, if other imaging parameters are maintained constant, T1 can be determined in only a single further measurement cycle for each different field strength. That is, N relaxometry data points can be determined in only N+1 measurement cycles.

It is believed that this novel switched-field approach to NMR relaxometry provides a more practical way to achieve in vivo relaxometry in magnetic resonance imaging than heretofore. (For example, see an earlier in vivo MRI relaxation technique as described in Crooks et al, "Magnetic Resonance Imaging: Effects of Magnetic Field Strength," Radiology, Vol. 151, No. 1, April 1984, pp 127-133.)

Thus, compared to prior relaxometry approaches (even the non-imaging approaches), we have achieved considerable advantage in at least each of the following ways:

1. Use of an initial 90° NMR RF nutation pulse (in one of the exemplary embodiments) to more quickly initialize nuclei magnetization state;
2. acquisition of N relaxometry data points (T1,B) using only N+1 measurement cycles (in both exemplary embodiments); and
3. MRI of relaxometry data measured in such time efficient procedures (in both exemplary embodiments)—e.g., thus permitting interleaved imaging measurements so as to preserve registration of patient anatomy vis-a-vis the acquired relaxometry data for each imaged voxel.

These as well as other objects and advantages of this invention will be more completely understood and appreciated by careful study of the following detailed description of the presently preferred exemplary embodiments of this invention taken in conjunction with the accompanying drawings, of which:

Figure 1:
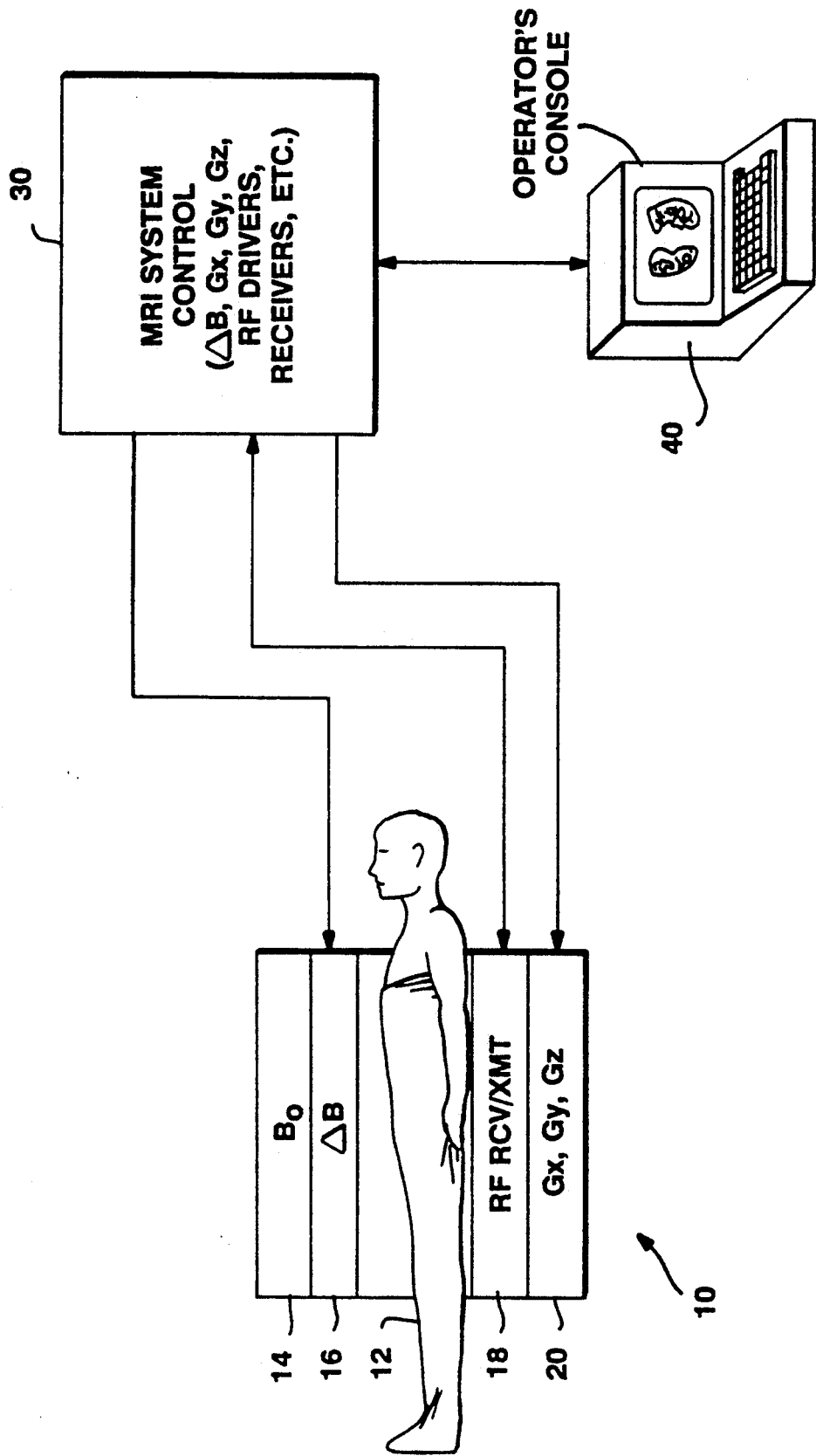
FIG. 1 is a simplified general block diagram of a switched-field MRI system suitable for practicing the exemplary embodiment of this invention.

FIG. 1 is a simplified schematic depiction of a typical MRI system that has been adapted to practice this invention. For example, it includes the usual gantry system 10 in which an image volume is adapted to receive a living human subject 12. A suitable generator 14 of a substantially homogeneous background magnetic field $B_o$ is provided. This may be a solenoidal cryogenic electromagnet (with the main background magnetic field oriented horizontally), a suitable permanent magnet structure (typically with the field oriented vertically) or the like.

An additional switched "background" magnetic field $\Delta B$ generator 16 is also provided as described in our above-referenced related copending parent application Ser. No. 07/545,068 so as to selectively alter the background magnetic field strength at selected times during MRI data gathering cycles. The usual RF receiving and/or transmitting coils 18 are also provided and closely RF coupled to the image volume. The usual gradient coil structures $G_x$, $G_y$, $G_z$, 20 are also provided.

The controllable portions of the gantry system 10 are controlled by a suitable MRI system control 30 having a system of computers, input/output drivers, RF receiver/transmitter circuits, etc., as will be known to those skilled in this art. Typically, the interface for operator control may be an operator console 40 having the usual keyboard and screen for inputting control commands for viewing MRI data, parameters, images, etc. As will be appreciated, other peripheral devices are typically provided for recording MRI data, images, etc.

Figure 2:
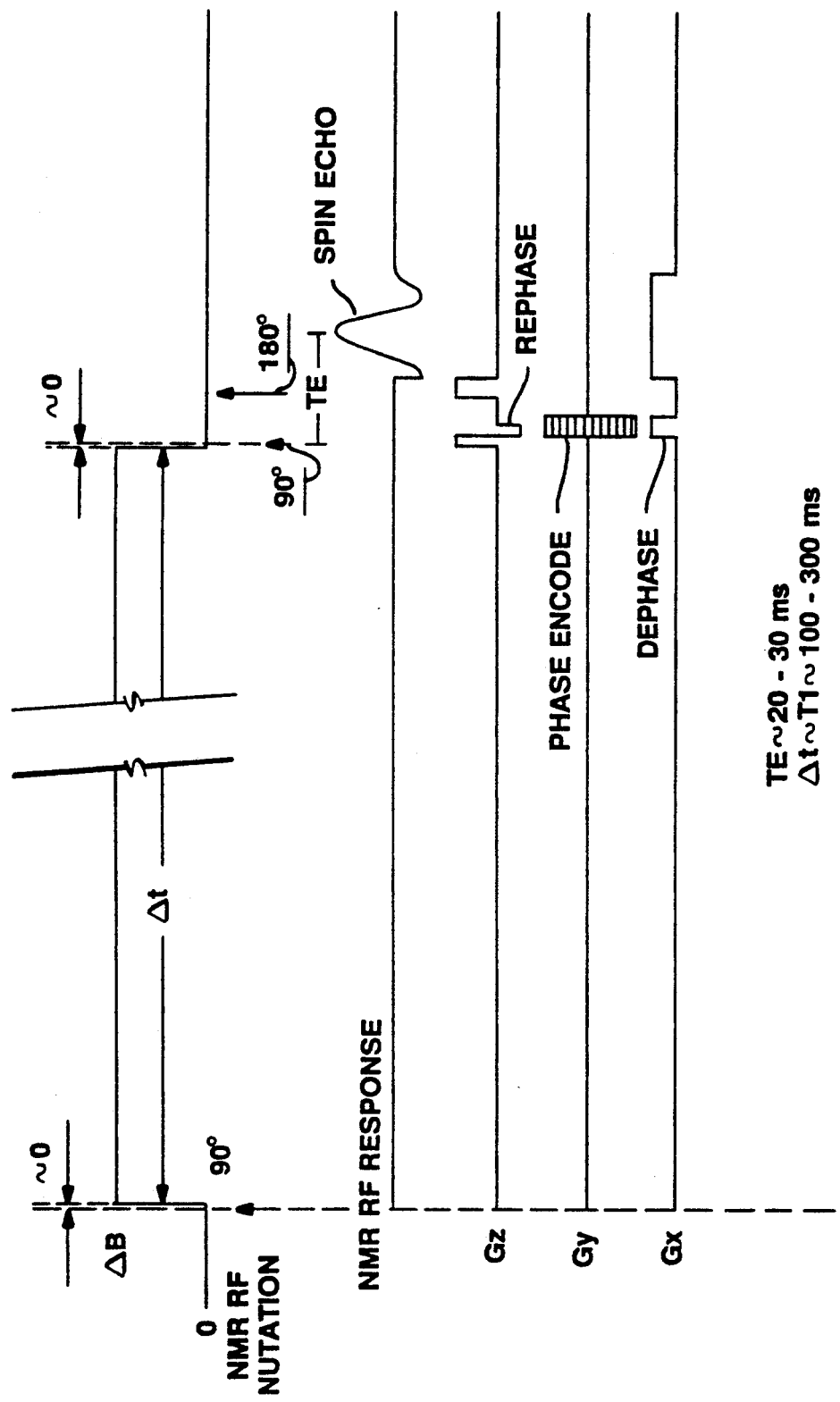
FIG. 2 is a timing diagram showing an exemplary sequence of RF nutation pulses switched magnetic fields, magnetic gradients, etc., for an exemplary embodiment of this invention.

The MRI system of FIG. 1 is, in one exemplary embodiment, programmed so as to effect the exemplary MRI relaxometry cycles depicted at FIG. 2. Here, immediately after a 90° NMR RF nutation pulse, the switched field is turned "on" to effect a composite background magnetic field strength of a selected magnitude. This switched field strength is maintained for a time on the order of the value of the NMR T1 parameter to be measured (e.g., 100-300 milliseconds). In other words, the NMR nuclei are preferably permitted to approach saturation magnetization in accordance with the switched field strength magnitude.

Immediately thereafter, 90° and 180° NMR RF nutation pulses are imposed in relatively quick succession so as to elicit an NMR RF spin echo signal response still having a characteristic magnitude related to the earlier switched background magnetic field strength. The time to echo or TE parameter is preferably made relatively short compared to the expected T1 value. For example, TE is, in the exemplary embodiment, maintained less than about 20 to 30 milliseconds.

The $G_z$, $G_y$ and $G_x$ gradient field pulses depicted in FIG. 2 are typical of those used for two-dimensional Fourier Transform (2DFT) MRI. In this manner, spin echo response magnitudes for each voxel of a two-dimensional image "slice" volume through the patient 12 may be obtained. As should be apparent, three-dimensional Fourier Transform MRI, projection reconstruction MRI or other types of MRI measurement cycles could also be used. Furthermore, in vivo relaxometry measurements could be made on selected "slices" as a whole or other portions within the image volume or engross for the entire image volume without any imaging per se.

The elicited spin echo (SE) RF responses are proportional (assuming all other imaging parameters to remain constant) to the following function of the time duration $\Delta t$ and the T1 parameter associated with the switched background magnetic field:

$$SE \propto 1 - \exp(-\Delta t / T1) \quad \text{(Equation 1)}$$

At one particular field strength, if TE is kept constant, then two different measurements (at different TR values) are needed to solve for T1 since there are two unknowns. One unknown is T1, the other is a multiplicative combination of equilibrium magnetization density, receiver efficiency and gain, and an exponential factor of T2 decay. If the field is now switched (e.g., upwards by 50%), the "other" factor (involving equilibrium magnetization density, receiver efficiency, gain and T2, etc) goes linearly with the field strength. Thus, after the first data point is measured using as few as two measurement cycles, there remains effectively only one unknown for each different field strength to be probed. Accordingly, by measuring SE signal using two different $\Delta t$ values at one field strength, then measuring one point with a $\Delta t$ on the order of T1 at each new field strength (TE being held constant) one can calculate the desired T1 value at each new probed magnetic field strength using but a single further measurement cycle.

Since there is no read-out actually taken during the time the switched field is present, there is less requirement for the switched field to be absolutely constant, homogeneous, etc. of course to the extent the switched field can be made constant and homogeneous, that would be desirable.

Figure 3:
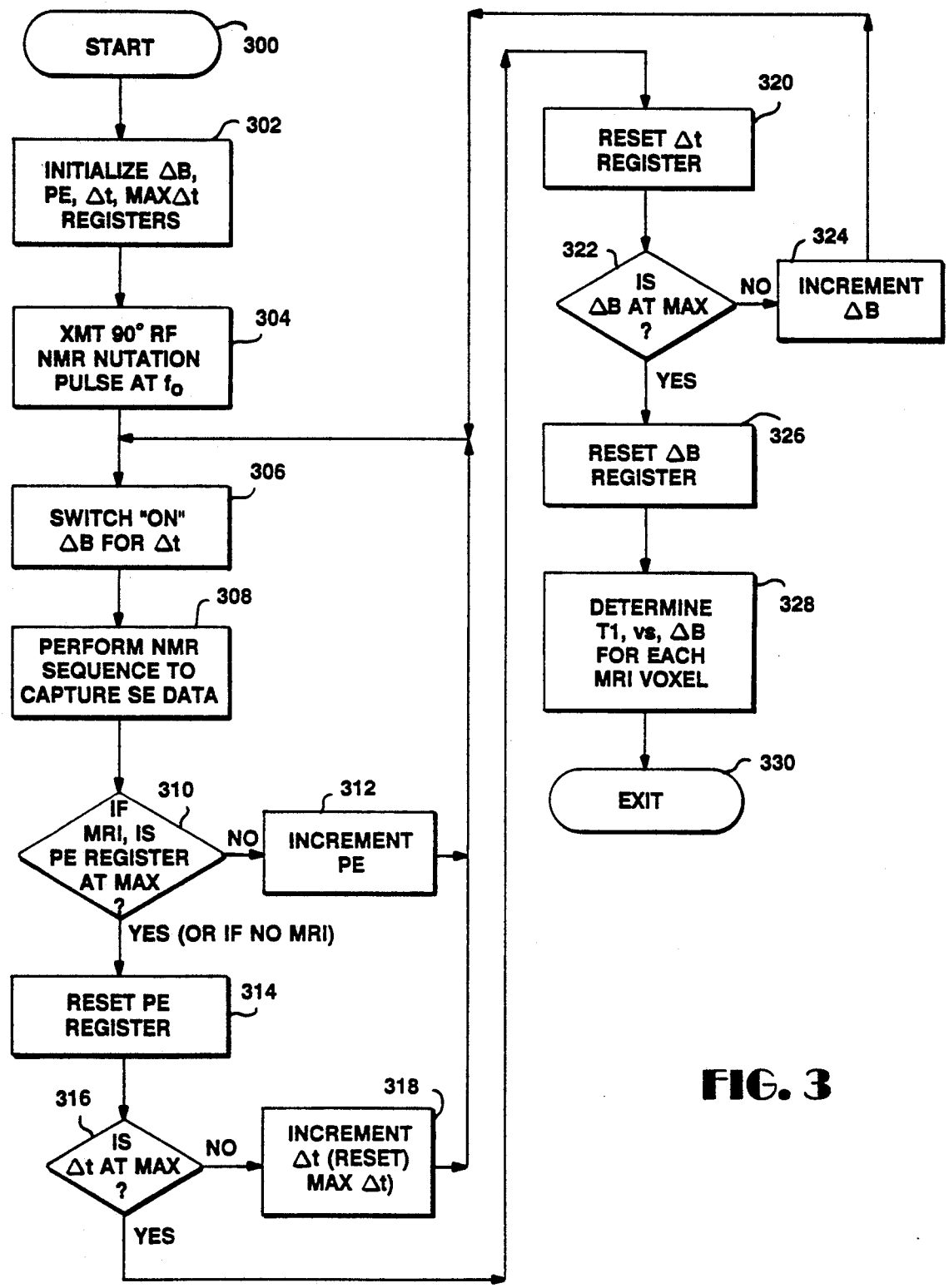
FIG. 3 is a flowchart of an exemplary program segment that may be incorporated into the programmed MRI system control of FIG. 1 so as to practice the exemplary embodiment of this invention.

To implement the saturation recovery NMR relaxometry sequence depicted in FIG. 2, the NMR system control 30 of FIG. 1 can be programmed as generally depicted in the flowchart of FIG. 3. Here, upon entry at 300 to this program segment, initialization is effected at 302 (e.g., so as to initialize the values stored in the switched field magnitude register $\Delta B$, the phase encoding register PE and the switched field duration register $\Delta t$).

Thereafter, a 90° RF NMR nutation pulse is transmitted at the usual Larmor frequency associated with the nominal background $B_o$ at 304. Immediately thereafter, a switched field is switched on for the $\Delta \Delta t$ duration at 306. Immediately, thereafter, a 90°-180° NMR sequence is performed at 308 so as to capture suitable spin echo data for the existing phase encoded $G_y$ value. A test is then made at 310 (if magnetic resonance imaging is to be employed) so as to see if the phase encoding register has yet reached the maximum desired phase encoded value. If not, the phase encoding register PE is incremented at 312 and the cycle is repeated by returning control to block 306.

Eventually, all of the desired phase encoded spin echo responses will have been captured (e.g., 256 of them if MRI is being performed or zero if no imaging is to be performed) and the phase encoding register PE will be reset at 314 in readiness for a subsequent MRI cycle. A test is then made at 316 to see if the duration register $\Delta t$ is yet at its maximum value. If not, that register is incremented at 318 (e.g., by an integer multiple) and control is again returned to block 306 for another MRI cycle at the next $\Delta t$ increment. As will be understood, in the exemplary embodiment, the maximum $\Delta t$ value will be reset at 318 so that after the first relaxometry data point has been captured only one $\Delta t$ value is used for each new $\Delta B$ measurement field.

After the desired number of MRI cycles for different $\Delta t$ increments (e.g., two on the first $\Delta B$ value, one thereafter), the $\Delta t$ register is reset at block 320 in readiness for a future data gathering cycle and a test is made at 322 to see if the switched field magnitude register $\Delta B$ is yet at its desired maximum value. If not, the switched field is incremented at 324 and control is again returned back to block 306 for yet another MRI data gathering cycle. Finally, after data is gathered for all of the desired $\Delta B$ increments, the $\Delta B$ register is reset at 326.

At that time (or subsequently if desired) the desired relaxometry measurements of T1 versus $\Delta B$ may be determined for each MRI voxel (e.g., the first using two $\Delta t$ values in accordance with the teachings of the related Ortendahl et al teachings and subsequent points using only single $\Delta t$ values per point as noted above). Ultimately, the program segment of FIG. 3 is then exited at 330 and control is returned to other conventional programming within the MRI system control 30.

As should now be apparent, individual relaxometry measurement cycles (as depicted in FIG. 2) can also be interleaved between conventional MRI data acquisition cycles to better preserve data/image registration of the patient.

Figure 4:
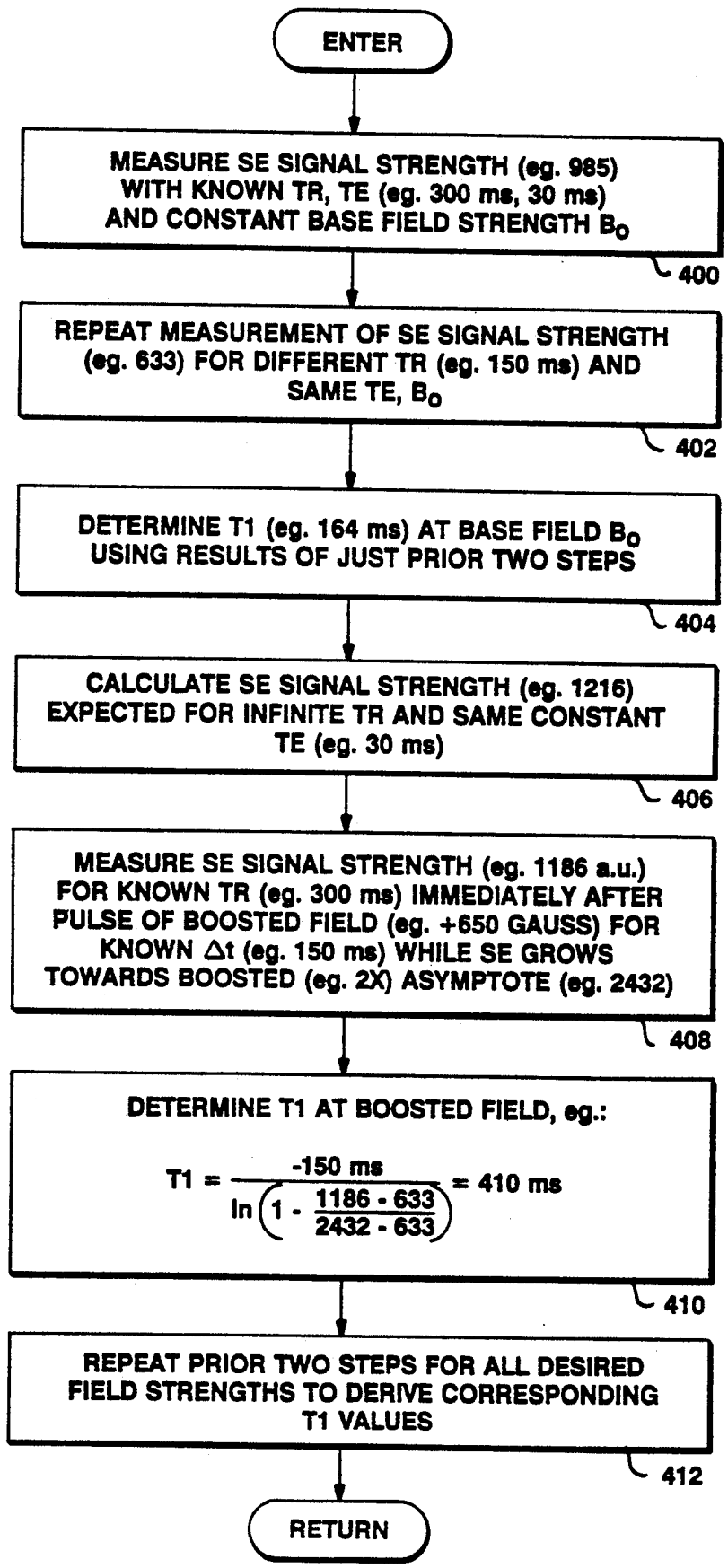
FIG. 4 is a flowchart of another exemplary program segment that may be incorporated into the programmed MRI system control of FIG. 1 so as to practice the exemplary embodiment of this invention.

Another exemplary embodiment (as depicted in FIG. 4) avoids the use of a 90° RF saturation pulse prior to each change in the background field $B_o$. Here, use is made of the well-known relationship between NMR nuclei magnetization (and the related NMR spin echo (SE) signal magnitude) changes with respect to the well-known NMR parameters TE, TR, T1 and T2:

$$SE \propto [\exp(-TE/T2)][1+\exp(-TR/T1)-2\exp\{-(TR-TE/2)/T1\}]$$ (Equation 2)

First, by keeping TE constant, the TE and T2 dependence can be reduced to just another constant factor of proportionality:

$$SE \propto 1+\exp(-TR/T1)-2\exp[-(TR-TE/2)/T1]$$ (Equation 3)

Then, the two NMR spin echo experiments (e.g., SE=985 and 633 signal strength units, respectively) depicted at 400, 402 at the constant base background field $B_o$ (e.g., 650 Gauss) and constant TE (e.g., 30 ms) but different TR values (e.g., 300 ms and 150 ms) permits determinations of T1 (e.g., 164 ms) at step 404 using conventional exponential curve fitting techniques (e.g., empirical trial and error using different known exponential curves).

Once T1 at the base field $B_o$ is thus derived, the asymptote (e.g., 1216 signal strength units) is similarly ascertainable at 406 for an infinite TR spin echo experiment using the same other NMR parameters.

Thereafter, as depicted at steps 408 and 410, for each changed background field strength $\Delta B$ pulse of $\Delta t$ duration, one immediately following NMR spin echo experiment (using the same constant TE at the same base field $B_o$) suffices to determine T1 at the changed background field value:

$$T1 = -\Delta t/\ln[1-(SE_m-SE_x)/(M \cdot SE_a - SE_x)]$$ (Equation 4)

where

T1 = the T1 NMR parameter value at the changed background field strength $\Delta t$ = the time duration of the changed field pulse $SE_m$ = the spin echo signal magnitude measured immediately following the changed field pulse $SE_x$ = the spin echo signal magnitude which would result at hypothetical TR interval which would result if $\Delta t$ is reduced to zero M = the ratio of the changed magnetic field to the background magnetic field $SE_a$ = the asymptotic spin echo signal magnitude for the background magnetic field strength In the example depicted at steps 408 and 410, the measured spin echo magnitude was 1186 of the same arbitrary signal strength units used in the other FIG. 4 measurements. Thus, T1 at the boosted 1300 Gauss field strength is determined to be 410 ms. Repetition of steps 408 and 410 for other field strengths will yield the respectively corresponding T1 values as depicted at 412 in FIG. 4.

To summarize, first, with a TR=300 ms, TE=30 ms, constant field sequence one measures a signal of 985 (arbitrary units). Repeating this with TR 150 ms, the same echo time TE gives a measured signal of 633 of the same arbitrary units. One can now solve the T1 (e.g., 164 ms) at the base field strength and the signal (e.g., 1216) we would expect to measure in an infinite TR spin echo experiment at the same constant TE. Now, with one more measurement using a TR=300 ms, using a field boost of 650 Gauss for 150 ms produces a measured signal of 1186. We can use this one piece of data to get the new T1. After 150 ms at the lower field, if the NMR spin echo experiment were repeated at that TR (i.e., TR=150 ms), then the SE signal and/or nuclei magnetization would be 633 units. However, in reality in this experiment, in the remaining 150 ms, the magnetization grows towards the new equilibrium asymptote value of 2432 (this is 2 times the old asymptote; the factor of two comes from the 2× boost in the field) and actually is measured as 1186. This is enough to give T1 at the higher field $$T1 = \frac{-150 \text{ ms}}{\ln\left(1 - \frac{1186 - 633}{2432 - 633}\right)} = 410 \text{ ms}$$

As will be apparent to those in the art, other cases such as for different times for high and low field strengths and multi-slice sequences can be similarly derived. It will also be apparent that the process of FIG. 4 can be viewed as a flowchart description of a computer program subroutine module.

While only two exemplary embodiments have been described in detail, those skilled in the art will realize that many variations and modifications may be made in such exemplary embodiments while yet retaining many of the novel features and advantages of this invention. Accordingly, all such variations and modifications are intended to be included within the scope of the appended claims.

What is claimed:

1. A method for obtaining a NMR relaxometry image of in vivo patient tissue using a MRI system having a nominally fixed background magnetic field, said method comprising the steps of:
   (a) subjecting said patient tissue to a magnetic field strength $\Delta B$ which is different than said fixed background magnetic field for a substantial time interval $\Delta t$ during which the sample exhibits a respectively corresponding NMR relaxation parameter value;
   (b) in a further time interval, subsequently performing a MRI data acquisition cycle using said fixed background magnetic field as the field which determines the NMR Larmor RF frequency during MRI; and
   (c) repeating steps (a) and (b) for a plurality of different magnetic field strengths $\Delta B$ to generate a NMR relaxometry image of said patient tissue.

2. A method as in claim 1 wherein step (a) is immediately preceded by a 90° RF NMR nutation pulse.

3. A method as in claim 1 or 2 wherein T1 NMR data is obtained for at least one field strength $\Delta B$ by repeating steps (a) and (b) for different time intervals $\Delta t$ using the same field strength $\Delta B$ and wherein further T1 NMR data is obtained for at least some field strengths $\Delta B'$ by repeating steps (a) and (b) only once for each field strength $\Delta B'$.

4. A method as in claim 1 wherein further MRI measurements are interleaved with one or more repetitions of steps (a) and (b).

5. A method of magnetic resonance imaging which provides an in vivo T1 NMR relaxometry image of patient tissue, said method comprising the steps of:
   (a) applying NMR RF nutation pulse to said patient tissue using a fixed background magnetic field;
   (b) applying a different magnetic field strength $\Delta B$ to said patient tissue for a time interval $\Delta t$;
   (c) thereafter performing a MRI data acquisition cycle using said fixed background magnetic field and obtaining NMR data for plural voxels representative of the T1 parameter values for patient tissues within each voxel at said different magnetic field strength $\Delta B$;

(d) repeating steps (a)–(c) for plural different magnetic field strengths ΔB thus acquiring T1 NMR relaxometry image data for said patient tissue.

6. A method for performing NMR relaxometry, said method comprising:
   (a) subjecting a sample to a predetermined RF NMR nutation pulse at a predetermined and fixed background magnetic field strength;
   (b) thereafter subjecting said sample to a different magnetic field strength for a time interval during which the sample exhibits a respectively corresponding NMR relaxation parameter value;
   (c) in a further time interval, subsequently measuring said corresponding NMR relaxation parameter value using said predetermined and fixed background magnetic field strength as the field which determines the NMR Larmor RF frequency during MRI; and
   (d) repeating steps (a), (b) and (c) for a plurality of different magnetic field strengths thereby to generate NMR relaxometry data for said sample.

7. A method as in claim 6 wherein step (b) is performed without substantial delay after step (a) and wherein step (c) is performed without substantial delay after step (b).

8. A method as in claim 6 wherein the different magnetic field strength is substantially constant throughout step (b).

9. A method as in claim 6 wherein steps (a)–(c) comprise a magnetic resonance imaging sequence providing NMR relaxometry data for each of plural volume elements within said sample.

10. A method for performing in vivo NMR relaxometry, said method comprising:
    (a) subjecting tissue, in vivo, to a background magnetic field $B_o + \Delta B$;
    (b) thereafter performing an NMR sequence on said tissue, in vivo, in the presence of a background magnetic field $B_o$ using NMR RF nutation signals and generating NMR RF response signals in a frequency bandwidth $\Delta f_o$ characteristic of magnetic field strength $B_o$; and
    (c) repeating steps (a) and (b) only once for each of at least some different values of ΔB to generate NMR relaxometry data for said tissue which is representative of its NMR relaxation times for different background field strengths while maintaining the NMR RF signals within the same bandwidth $\Delta f_o$.

11. A method as in claim 10 wherein steps (a) and (b) are repeated at least twice for one value of ΔB using different time intervals Δt but are otherwise repeated only once for each other value of ΔB.

12. A method as in claim 10 or 11 wherein ΔB is substantially constant throughout step (a) and wherein step (a) is immediately preceded by a 90° RF NMR nutation pulse.

13. A method as in claim 10 or 11 wherein steps (a) and (b) comprise a magnetic resonance imaging sequence providing NMR RF response signals characteristic of each of a plurality of tissue volume elements whereby NMR relaxometry data is generated for each of plural of said volume elements.

14. A method as in claim 13 wherein said magnetic resonance imaging sequence includes a multi-dimensional Fourier Transform MRI sequence.

15. A method as in claim 10 or 11 wherein step (a) includes applying an initial NMR RF nutation pulse prior to switching on said ΔB magnetic field.

16. A method as in claim 15 wherein there is substantially no time delay between cessation of said initial RF nutation pulse and the switching on of said ΔB magnetic field.

17. A method as in claim 15 wherein said initial RF nutation pulse is a 90° nutation pulse.

18. A method as in claim 10 or 11 wherein step (b) includes applying a first NMR RF nutation pulse.

19. A method as in claim 18 wherein there is substantially no time delay between cessation of said ΔB magnetic field and the initiation of said first RF nutation pulse.

20. A method as in claim 18 wherein said first NMR RF nutation pulse is a 90° nutation pulse.

21. Apparatus for obtaining a NMR relaxometry image of in vivo patient tissues using a MRI system having a nominally fixed background magnetic field, said apparatus comprising:
    (a) means for subjecting said patient tissue to a magnetic field strength ΔB which is different than said fixed background magnetic field for a substantial time interval Δt during which the sample exhibits a respectively corresponding NMR relaxation parameter value;
    (b) means for subsequently performing a MRI data acquisition cycle in a further time interval using said fixed background magnetic field as the field which determines the NMR Larmor frequency during MRI; and
    (c) means for causing means (a) and (b) to repeat their operation for a plurality of different magnetic field strengths ΔB to generate a NMR relaxometry image of said patient tissue.

22. Apparatus as in claim 21 further comprising means for generating a 90° RF NMR nutation pulse immediately prior to imposition of said different magnetic field strength ΔB.

23. Apparatus as in claim 21 or 22 wherein said means for repeating operates to cause repetition for at least one field strength ΔB using different time intervals Δt but the same field strength ΔB and which causes repetition for at least some field strengths ΔB' by repeating operation of means (a) and (b) only once for each field strength ΔB'.

24. Apparatus as in claim 21 comprising means for interleaving MRI measurements with one or more repetitive operations of means (a) and (b).

25. Apparatus for magnetic resonance imaging which provides an in vivo T1 NMR relaxometry image of patient tissue, said apparatus comprising:
    (a) means for applying NMR RF nutation pulse to said patient tissue using a fixed background magnetic field;
    (b) means for applying a different magnetic field strength ΔB to said patient tissue for a time interval Δt;
    (c) means for performing an MRI data acquisition cycle using said fixed background magnetic field and obtaining NMR data for plural voxels representative of the T1 parameter values for patient tissues within each voxel at said different magnetic field strength ΔB;
    (d) means for causing repetitive operation of means (a)–(c) for plural different magnetic field strengths ΔB thus acquiring T1 NMR relaxometry image data for said patient tissue.

26. Apparatus for performing NMR relaxometry, said apparatus comprising:

(a) means for subjecting a sample to a predetermined RF NMR nutation pulse at a predetermined and fixed background magnetic field strength;

(b) means for thereafter subjecting said sample to a different magnetic field strength for a first time interval during which the sample exhibits a respectively corresponding NMR relaxation parameter value;

(c) means for subsequently measuring said corresponding NMR relaxation parameter value using said predetermined and fixed background magnetic field strength after said time interval and in a further second time interval as the field which determines the NMR Larmor RF frequency during MRI; and (d) means for repeatedly operating means (a)–(c) for a plurality of different magnetic field strengths thereby to generate NMR relaxometry data for said sample.

27. Apparatus as in claim 26 wherein means (b) operates without substantial delay after means (a) and means (c) operate without substantial delay after means (b).

28. Apparatus as in claim 26 wherein means (b) includes means for maintaining the different magnetic field strength substantially constant during said first time interval.

29. Apparatus as in claim 26 wherein means (c) comprises means for performing a magnetic resonance imaging sequence providing NMR relaxometry data for each of plural volume elements within said sample.

30. Apparatus for performing in vivo NMR relaxometry, said apparatus comprising:

(a) means for subjecting tissue, in vivo, to a background magnetic field $B_o + \Delta B$;

(b) means for thereafter performing an NMR sequence on said tissue, in vivo, in the presence of a background magnetic field $B_o$ using NMR RF nutation signals and generating NMR RF response signals in a frequency bandwidth $\Delta f_o$ characteristic of magnetic field strength $B_o$; and (c) means for repeatedly operating means (a) and (b) only once for each of at least some different values of $\Delta B$ to generate NMR relaxometry data for said tissue which is representative of its NMR relaxation times for different background field strengths while maintaining the NMR RF signals within the same bandwidth $\Delta f_o$.

31. Apparatus as in claim 30 wherein means (c) causes means (a) and (b) to be operated at least twice for at least one value of $\Delta B$ using different time intervals $\Delta t$ but otherwise causes repetitive operation of means (a) and (b) only once for each other value of $\Delta B$.

32. Apparatus as in claim 30 or 31 wherein means (a) includes means for maintaining $\Delta B$ substantially constant when it is switched on and wherein means (a) produces an initial 90° RF NMR nutation pulse.

33. Apparatus as in claim 30 or 31 wherein means (a) and (b) produce a magnetic resonance imaging sequence providing NMR RF response signals characteristic of each of a plurality of tissue volume elements whereby NMR relaxometry data is generated for each of plural of said volume elements.

34. Apparatus as in claim 33 wherein said means (a) and (b) generates a magnetic resonance imaging sequence including a two-dimensional Fourier Transform MRI sequence.

35. Apparatus as in claim 30 or 31 wherein means (a) includes means for applying an initial NMR RF nutation pulse prior to switching on said $\Delta B$ magnetic field.

36. Apparatus as in claim 35 wherein means (a) provides substantially no time delay between cessation of said initial RF nutation pulse and the switching on of said $\Delta B$ magnetic field.

37. Apparatus as in claim 35 wherein said means (a) provides said initial RF nutation pulse as a 90° RF nutation pulse.

38. Apparatus as in claim 30 or 31 wherein means (b) includes means for applying a first NMR RF nutation pulse.

39. Apparatus as in claim 38 wherein means (b) provides substantially no time delay between cessation of said $\Delta B$ magnetic field and the initiation of said first RF nutation pulse.

40. Apparatus as in claim 38 wherein means (b) produces said first NMR RF nutation pulse as a 90° nutation pulse.

* * * * *